US012812895B2

(12) United States Patent
Fujiwara et al.

(10) Patent No.: US 12,812,895 B2
(45) Date of Patent: Nov. 24, 2026

(54) SEMICONDUCTOR DEVICE WITH ALGAN AND INSULATING MEMBER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ikuo Fujiwara, Yokohama (JP); Tatsuo Shimizu, Shinagawa (JP); Masahiko Kuraguchi, Yokohama (JP); Aya Shindome, Yokohama (JP); Daimotsu Kato, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 371 days.

(21) Appl. No.: 18/423,436

(22) Filed: Jan. 26, 2024

(65) Prior Publication Data

US 2025/0063752 A1 Feb. 20, 2025

(30) Foreign Application Priority Data

Aug. 18, 2023 (JP) ................................ 2023-133660

(51) Int. Cl.

*H10D 30/47* (2025.01)
*H10D 62/17* (2025.01)
*H10D 64/27* (2025.01)

(52) U.S. Cl.

CPC ......... *H10D 30/475* (2025.01); *H10D 62/292* (2025.01); *H10D 64/513* (2025.01)

(58) Field of Classification Search

None

See application file for complete search history.

(56) References Cited

U.S. PATENT DOCUMENTS

2010/0025730 A1 2/2010 Heikman et al.
2014/0097471 A1* 4/2014 Briere .................... H10D 30/47 257/194

(Continued)

FOREIGN PATENT DOCUMENTS

JP 2011-529639 A 12/2011
JP 2016-111039 A 6/2016

(Continued)

*Primary Examiner* — Nduka E Ojeh

(74) *Attorney, Agent, or Firm* — Oblon, McClelland, Maier & Neustadt, L.L.P.

(57) ABSTRACT

According to one embodiment, a semiconductor device includes a first electrode, a second electrode, a third electrode, a first semiconductor member, a second semiconductor member, a first compound member, and a first insulating member. The third electrode includes a first electrode portion. The first semiconductor member includes $Al_{x1}Ga_{1-x1}N$ ($0 \le x1 < 1$). The first semiconductor member includes first to seventh partial regions. The second semiconductor member includes $Al_{x2}Ga_{1-x2}N$ ($0 < x2 \le 1$, $x1 < x2$). The second semiconductor member includes first and second semiconductor portions. The first compound member includes $Al_{z1}Ga_{1-z1}N$ ($0 < z1 \le 1$, $x2 < z1$). The first compound member includes first to fifth regions. The first insulating member includes first and second insulating portions. At least a part of the first insulating portion and at least a part of the second insulating portion is amorphous.

18 Claims, 1 Drawing Sheet

(56) References Cited

U.S. PATENT DOCUMENTS

| | | | | |
|---|---|---|---|---|
| 2015/0349117 | A1* | 12/2015 | Chu ..................... | H10D 30/015 |
| | | | | 438/270 |
| 2020/0027976 | A1* | 1/2020 | Mukai .................. | H10D 62/854 |
| 2022/0045202 | A1* | 2/2022 | Kajiwara ............. | H10D 30/015 |
| 2022/0130986 | A1* | 4/2022 | Kato .................... | H10D 30/475 |
| 2022/0254912 | A1* | 8/2022 | Ramdani .............. | H10D 30/475 |
| 2023/0025093 | A1 | 1/2023 | Kajiwara et al. | |

FOREIGN PATENT DOCUMENTS

| | | | |
|---|---|---|---|
| JP | 2017-188687 | A | 10/2017 |
| JP | 2020-17577 | A | 1/2020 |
| JP | 2021-136358 | A | 9/2021 |
| JP | 2022-70200 | A | 5/2022 |
| JP | 2022-540746 | A | 9/2022 |
| JP | 2023-17194 | A | 2/2023 |
| WO | WO 2010/014128 | A2 | 2/2010 |

* cited by examiner

SEMICONDUCTOR DEVICE WITH ALGAN AND INSULATING MEMBER

CROSS-REFERENCE TO RELATED APPLICATIONS

This application is based upon and claims the benefit of priority from Japanese Patent Application No. 2023-133660, filed on Aug. 18, 2023; the entire contents of which are incorporated herein by reference.

FIELD

Embodiments described herein generally relate to a semiconductor device.

BACKGROUND

For example, semiconductor devices such as transistors are desired to have improved characteristics.

DETAILED DESCRIPTION

Figure 1:
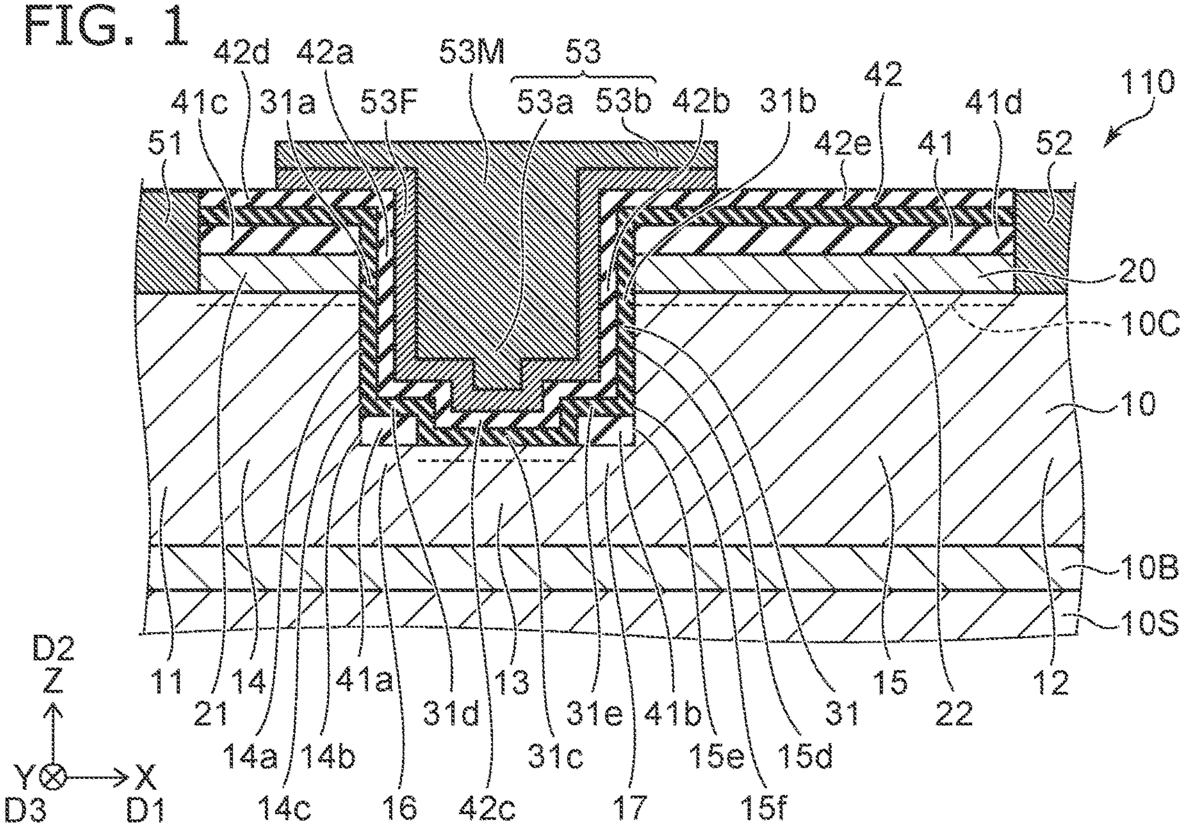
FIG. 1 is a schematic cross-sectional view illustrating a semiconductor device according to a first embodiment.

According to one embodiment, a semiconductor device includes a first electrode, a second electrode, a third electrode, a first semiconductor member, a second semiconductor member, a first compound member, and a first insulating member. The third electrode includes a first electrode portion. A position of the third electrode in a first direction from the first electrode to the second electrode is between a position of the first electrode in the first direction and a position of the second electrode in the first direction. The first semiconductor member includes $Al_{x1}Ga_{1-x1}N$ ($0<x1<1$). The first semiconductor member includes a first partial region, a second partial region, a third partial region, a fourth partial region, a fifth partial region, a sixth partial region, and a seventh partial region. A direction from the first partial region to the first electrode is along a second direction crossing the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. A position of the sixth partial region in the first direction is between the position of the fourth partial region in the first direction and the position of the third partial region in the first direction. A position of the seventh partial region in the first direction is between the position of the third partial region in the first direction and the position of the fifth partial region in the first direction. The second semiconductor member includes $Al_{x2}Ga_{1-x2}N$ ($0<x2\leq1$, $x1<x2$). The second semiconductor member includes a first semiconductor portion and a second semiconductor portion. A direction from the fourth partial region to the first semiconductor portion is along the second direction. A direction from the fifth partial region to the second semiconductor portion is along the second direction. The first compound member includes $Al_{z1}Ga_{1-z1}N$ ($0<z1\leq1$, $x2<z1$). The first compound member includes a first region, a second region, a third region, a fourth region, and a fifth region. The first region is provided between the fourth partial region and the first electrode portion in the first direction. The second region is provided between the first electrode portion and the fifth partial region in the first direction. The third region is provided between the third partial region and the first electrode portion in the second direction. The fourth region is provided between the first region and the third region. The fifth region is provided between the third region and the second region. The third region includes crystal. The first insulating member includes a first insulating portion and a second insulating portion. The first insulating portion is provided between the fourth partial region and the third region in the first direction. The first insulating portion is provided between the sixth partial region and the fourth region in the second direction. The second insulating portion is provided between the third region and the fifth partial region in the first direction. The second insulating portion is provided between the seventh partial region and the fifth region in the second direction. At least a part of the first insulating portion and at least a part of the second insulating portion is amorphous.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor member 10, a second semiconductor member 20, a first compound member 31, and a first insulating member 41. In this example, the semiconductor device 110 includes a substrate 10S and a nitride member 10B.

A first direction D1 from the first electrode 51 to the second electrode 52 is defined as an X-axis direction. One direction perpendicular to the X-axis direction is defined as a Z-axis direction. A direction perpendicular to the X-axis direction and the Z-axis direction is defines as a Y-axis direction.

The third electrode 53 includes a first electrode portion 53*a*. A position of the third electrode 53 in the first direction D1 is between a position of the first electrode 51 in the first direction D1 and a position of the second electrode 52 in the first direction D1.

The first semiconductor member 10 includes $Al_{x1}Ga_{1-x1}N$ ($0\leq x1<1$). The composition ratio x1 may be, for example, not less than 0 and not more than 0.13. The first semiconductor member 10 may be, for example, GaN. The first semiconductor member 10 may not include impurities that bring about conductivity.

The first semiconductor member 10 includes a first partial region 11, a second partial region 12, a third partial region 13, a fourth partial region 14, a fifth partial region 15, a sixth partial region 16, and a seventh partial region 17. A direction from the first partial region 11 to the first electrode 51 is along a second direction D2 crossing the first direction D1. The second direction D2 may be the Z-axis direction.

A direction from the second partial region 12 to the second electrode 52 is along the second direction D2. a direction from the third partial region 13 to the first electrode portion 53*a* is along the second direction D2. A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1. A position of the sixth partial region 16 in the first direction D1 is between the position of the fourth partial region 14 in the first direction D1 and the position of the third partial region 13 in the first direction D1. A position of the seventh partial region 17 in the first direction D1 is between the position of the third partial region 13 in the first direction D1 and the position of the fifth partial region 15 in the first direction D1.

The second semiconductor member 20 includes $Al_{x2}Ga_{1-x2}N$ ($0<x2\leq1$, $x1<x2$). The composition ratio x2 may be, for example, not less than 0.15 and not more than 0.35. The second semiconductor member 20 is AlGaN. The second semiconductor member 20 does not need to include impurities that bring about conductivity.

The second semiconductor member 20 includes a first semiconductor portion 21 and a second semiconductor portion 22. A direction from the fourth partial region 14 to the first semiconductor portion 21 is along the second direction D2. A direction from the fifth partial region 15 to the second semiconductor portion 22 is along the second direction D2.

The first compound member 31 includes $Al_{z1}Ga_{1-z1}N$ ($0<z1\leq1$, $x2<z1$). The composition ratio z1 may be not less than 0.9 and not more than 1. The first compound member 31 may be, for example, AlGaN or AlN.

The first compound member 31 includes a first region 31*a*, a second region 31*b*, a third region 31*c*, a fourth region 31*d*, and a fifth region 31*e*. The first region 31*a* is provided between the fourth partial region 14 and the first electrode portion 53*a* in the first direction D1. The second region 31*b* is provided between the first electrode portion 53*a* and the fifth partial region 15 in the first direction D1. The third region 31*c* is provided between the third partial region 13 and the first electrode portion 53*a* in the second direction D2. The fourth region 31*d* is provided between the first region 31*a* and the third region 31*c*. The fifth region 31*e* is provided between the third region 31*c* and the second region 31*b*. The third region 31*c* includes crystals. At least a part of the third region 31*c* includes crystals. The third region 31*c* has polarization, for example.

The first insulating member 41 includes a first insulating portion 41*a* and a second insulating portion 41*b*. The first insulating portion 41*a* is provided between the fourth partial region 14 and the third region 31*c* in the first direction D1. The first insulating portion 41*a* is provided between the sixth partial region 16 and the fourth region 31*d* in the second direction D2. The second insulating portion 41*b* is provided between the third region 31*c* and the fifth partial region 15 in the first direction D1. The second insulating portion 41*b* is provided between the seventh partial region 17 and the fifth region 31*e* in the second direction D2.

At least a part of the first insulating portion 41*a* and at least a part of the second insulating portion 41*b* are amorphous. These parts, for example, have no polarization.

A current flowing between the first electrode 51 and the second electrode 52 can be controlled by a potential of the third electrode 53. The potential of the third electrode 53 may be, for example, a potential based on a potential of the first electrode 51. The first electrode 51 functions, for example, as a source electrode. The second electrode 52 functions, for example, as a drain electrode. The third electrode 53 functions as, for example, a gate electrode. The semiconductor device 110 is, for example, a transistor.

The first semiconductor member 10 includes a portion facing the second semiconductor member 20. A carrier region 10C is formed in this portion. The carrier region 10C is, for example, a two-dimensional electron gas. The semiconductor device 110 is, for example, a HEMT (High Electron Mobility Transistor).

In the embodiment, the third region 31*c* is provided. For example, the third partial region 13 includes a portion facing the third region 31*c*. The carrier region 10C is formed in this portion. In the third region 31*c*, the Al composition ratio z1 is high. High carrier density can be obtained. For example, low on-resistance can be obtained.

In the embodiment, the first insulating portion 41*a* and the second insulating portion 41*b* are provided. The carrier density is low in the sixth partial region 16 and the seventh partial region 17 corresponding to these regions. Or no carrier is generated. For example, a high threshold voltage can be stably obtained. For example, normally-off operation is obtained. According to the embodiment, a stably high threshold voltage can be obtained. According to the embodiment, a semiconductor device with improved characteristics can be provided.

Depending on the voltage applied to the third electrode 53, carriers can flow through the sixth partial region 16 and the seventh partial region 17.

In the semiconductor device 110, two amorphous insulating portions (the first insulating portion 41*a* and the second insulating portion 41*b*) are provided. As a result, the carrier region 10C is divided at two positions. Threshold voltage can be controlled more stably.

For example, the first region 31*a* and the second region 31*b* include crystals. It is easy to obtain low on-resistance.

At least a part of the fourth region 31*d* and at least a part of the fifth region 31*e* may be amorphous. For example, crystal strain is likely to be relaxed. For example, high crystallinity is easily obtained in the third region 31*c*, the first region 31*a*, and the second region 31*b*.

The distance between the first electrode 51 and the third electrode 53 (first distance) is shorter than the distance between the third electrode 53 and the second electrode 52 (second distance). It is easy to obtain stable operation. The first electrode 51, the second electrode 52, and the third electrode 53 may extend, for example, along a third direction D3. The third direction D3 crosses a plane including the first direction D1 and the second direction D2. The third direction D3 may be, for example, the Y-axis direction.

In the embodiment, the first electrode portion 53*a* is provided between the fourth partial region 14 and the fifth partial region 15 in the first direction D1. The third electrode 53 is, for example, a recessed gate electrode. High threshold voltage can be stably obtained.

As shown in FIG. 1, the third electrode 53 may include a second electrode portion 53*b*. The second electrode portion 53*b* is connected to the first electrode portion 53*a*. A part of the second electrode portion 53*b* overlaps the fourth partial region 14 in the second direction D2. Another part of the second electrode portion 53*b* overlaps the fifth partial region 15 in the second direction D2.

As shown in FIG. 1, the third electrode 53 includes a first electrode region 53F and a second electrode region 53M. At least a part of the first electrode region 53F is located between the first semiconductor member 10 and the second electrode region 53M and between the second semiconductor member 20 and the second electrode region 53M. The first electrode region 53F includes, for example, nitrogen and a metal element. In one example, the first electrode region 53F includes TIN. The first electrode region 53F is, for example, an intermediate layer. The second electrode region 53M includes, for example, metal. In one example, the second electrode region 53M includes, for example, aluminum.

The semiconductor device 110 may further include a second insulating member 42. The second insulating member 42 includes a first insulating region 42*a*, a second insulating region 42*b*, and a third insulating region 42*c*. The first insulating region 42*a* is provided between the first region 31*a* and the first electrode portion 53*a* in the first direction D1. The second insulating region 42*b* is provided between the first electrode portion 53*a* and the second region 31*b* in the first direction D1. The third insulating region 42*c* is provided between the third region 31*c* and the first electrode portion 53*a*, between the fourth region 31*d* and the first electrode portion 53*a*, and between the fifth region 31*e* and the first electrode portion 53*a*. By providing the second insulating member 42, high insulation is obtained. Stable operation is obtained.

For example, the second insulating member 42 includes silicon and oxygen. The first insulating member 41 includes silicon and nitrogen. The first insulating member 41 does not include oxygen. Alternatively, the concentration of oxygen in the first insulating member 41 is lower than the concentration of oxygen in the second insulating member 42. The first insulating member 41 includes, for example, SiN. The second insulating member 42 includes silicon oxide. The first insulating member 41 includes, for example, $SiO_2$.

As shown in FIG. 1, the first insulating member 41 may further include a third insulating portion 41*c* and a fourth insulating portion 41*d*. The first semiconductor portion 21 is provided between the fourth partial region 14 and the third insulating portion 41*c* in the second direction D2. The second semiconductor portion 22 is provided between the fifth partial region 15 and the fourth insulating portion 41*d* in the second direction D2.

As shown in FIG. 1, the second insulating member 42 may further include a fourth insulating region 42*d* and a fifth insulating region 42*e*. The third insulating portion 41*c* is provided between the first semiconductor portion 21 and the fourth insulating region 42*d* in the second direction D2. The fourth insulating portion 41*d* is provided between the second semiconductor portion 22 and the fifth insulating region 42*e* in the second direction D2.

For example, the third region 31*c* contacts the third partial region 13. The first insulating portion 41*a* contacts the sixth partial region 16. The second insulating portion 41*b* contacts the seventh partial region 17. The first insulating portion 41*a* contacts the fourth partial region 14. The second insulating portion 41*b* contacts the fifth partial region 15.

In the semiconductor device 110, the first semiconductor member 10 is provided between the substrate 10S and the second semiconductor member 20. The nitride member 10B is provided between the substrate 10S and the first semiconductor member 10. The substrate 10S may be, for example, a silicon substrate. The nitride member 10B may include, for example, a nitride semiconductor. The nitride member 10B may include, for example, Al, Ga, and nitrogen. The nitride member 10B is, for example, a buffer layer.

Figure 2:
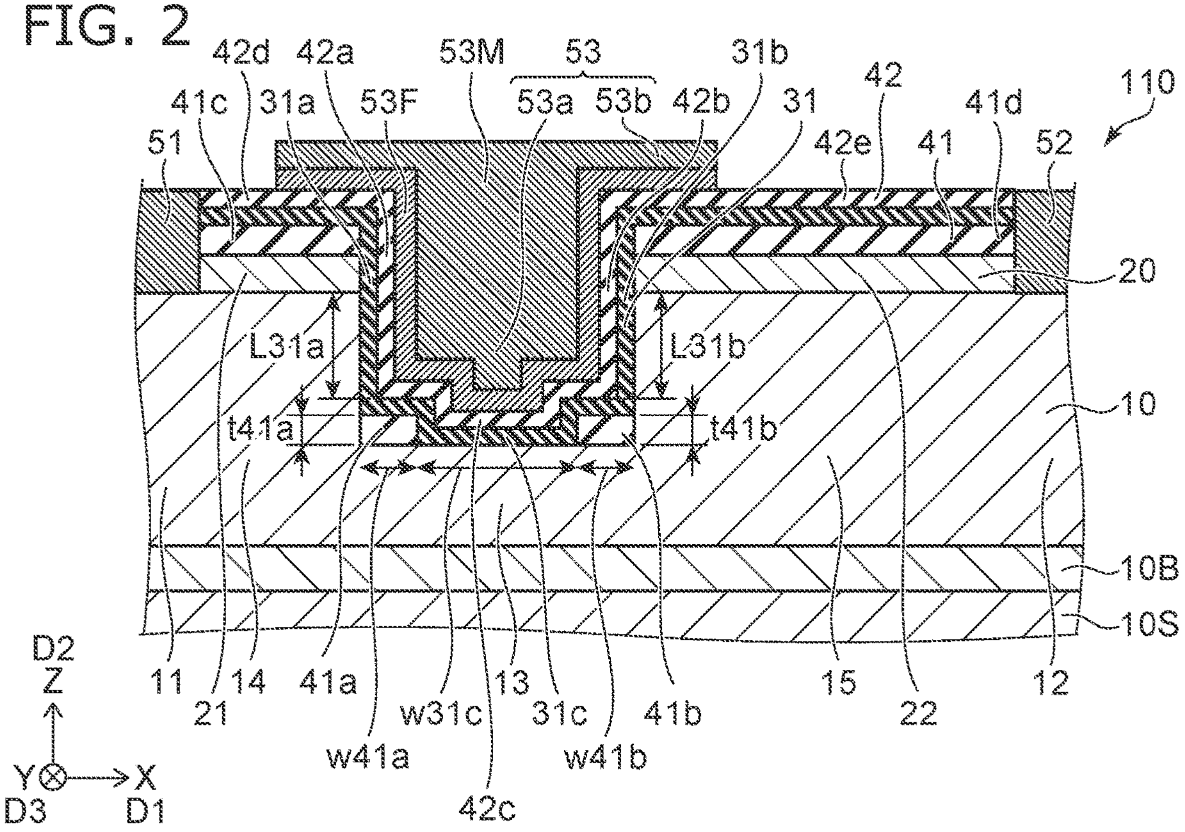
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, a length of the first insulating portion 41*a* along the first direction D1 is defined as a first insulating portion length w41*a*. A length of the first insulating portion 41*a* along the second direction D2 is defined as a first insulating portion thickness t41*a*. The length of the second insulating portion 41*b* along the first direction D1 is defined as a second insulating portion length w41*b*. A length of the second insulating portion 41*b* along the second direction D2 is defined as a second insulating portion thickness t41*b*.

In the embodiment, a first ratio of the first insulating portion length w41*a* to the first insulating portion thickness t41*a* is preferably not less than 0.5 and not more than 1.5. A second ratio of the second insulating portion length w41*b* to the second insulating portion thickness t41*b* is preferably not less than 0.5 and not more than 1.5. The electric field is effectively controlled in the corner portion including the first insulating portion 41*a* or the second insulating portion 41*b*. For example, the electric field distribution tends to be uniform at the bottom edge of the recess.

A sum of the first insulation portion length w41*a* and the first insulation portion thickness t41*a* is defined as a first sum. A sum of the second insulation portion length w41*b* and the second insulation portion thickness t41*b* is defined as a second sum. In embodiments, the first sum may be different from the second sum. For example, the first sum may be shorter than the second sum. Thereby, for example, the on-resistance can be lowered on the first electrode 51 (source electrode) side.

In one example, the first insulating portion length w41*a* is not less than 5 nm and not more than 200 nm. The second insulating portion length w41*b* is not less than 5 nm and not more than 200 nm.

A length of the third region 31*c* along the first direction D1 is defined as a third region length w31*c*. For example, the third region length w31*c* may be longer than the first insulating portion length w41*a*. The third region length w31*c* may be longer than the second insulating portion length w41*b*. For example, a ratio of the first insulating portion length w41*a* to the third region length w31*c* may be not less than 0.01 and less than 0.5. For example, the ratio of the first insulating portion length w41*a* to the third region length w31*c* may be 0.3 or less. A ratio of the second insulating portion length w41*b* to the third region length w31*c* may be not less than 0.01 and less than 0.5. The ratio of the second insulating portion length w41*b* to the third region length w31*c* may be 0.3 or less.

The first insulation portion thickness t41*a* may be, for example, not less than 5 nm and not more than 700 nm. The second insulation portion thickness t41*b* may be, for example, not less than 5 nm and not more than 700 nm.

As shown in FIG. 2, a length of the first region 31*a* along the second direction D2 is defined as a first region length L31*a*. The first region length L31*a* may be, for example, 150 nm or more. The first region length L31*a* may be, for example, 500 nm or less. A length of the second region 31*b* along the second direction D2 is defined as a second region length L31*b*. The second region length L31*b* may be, for example, 150 nm or more. The second region length L31*b* may be, for example, 500 nm or less. For example, it becomes easy to stably obtain a high threshold voltage.

As shown in FIG. 1, the fourth partial region 14 includes a first portion 14*a* contacting the first region 31*a* and a second portion 14*b* contacting the first insulating portion 41*a*. A first crystallinity of the first portion 14*a* may be higher than a second crystallinity of the second portion 14*b*. The fourth partial region 14 further includes a third portion 14*c* contacting the fourth region 31*d*. For example, a third crystallinity of the third portion 14*c* may be lower than the first crystallinity. Strain of the crystal is easily relaxed. For example, high crystallinity is easily obtained in the first portion 14*a* and the first region 31*a*. Low on-resistance is easily obtained.

As shown in FIG. 1, the fifth partial region 15 includes a fourth portion 15*d* contacting the second region 31*b* and a fifth portion 15*e* contacting the second insulating portion 41*b*. A fourth crystallinity of the fourth portion 15*d* may be higher than a fifth crystallinity of the fifth portion 15*e*. The fifth partial region 15 further includes a sixth portion 15*f* contacting the fifth region 31*e*. For example, a sixth crystallinity of the sixth portion 15*f* may be lower than the fourth crystallinity. Strain of the crystal is easily relaxed. For example, high crystallinity is easily obtained in the fourth portion 15*d* and the second region 31*b*. Low on-resistance is easily obtained.

In the embodiment, when the gate is in off-state, the resistance is high and the effect of increasing the threshold voltage due to potential drop is large. When turned on, the resistance decreases at both ends of the bottom of the recess. A high threshold value is obtained when off-state, and a low on-resistance is obtained when on-state.

The above configuration of the semiconductor device 110 can be formed by, for example, the following processes. A trench is formed in the structure body including the first semiconductor member 10 and the second semiconductor member 20. An insulating film is formed inside the trench. The first insulating portion 41*a* is obtained from a part of the insulating film. The second insulating portion 41*b* is obtained from another part of the insulating film. After that, the first compound member 31 and the second insulating member 42 are formed. The first electrode portion 53*a* of the third electrode 53 is formed in the remaining space of the trench.

In the embodiments, information regarding length and thickness is obtained by electron microscopy or the like. Information on the composition of materials can be obtained by SIMS (Secondary Ion Mass Spectrometry) or EDX (Energy dispersive X-ray spectroscopy).

Embodiments may include the following technical proposals.

(Technical Proposal 1)

A semiconductor device, comprising:

a first electrode;

a second electrode;

a third electrode including first electrode portion, a position of the third electrode in a first direction from the first electrode to the second electrode being between a position of the first electrode in the first direction and a position of the second electrode in the first direction;

a first semiconductor member including $Al_{x1}Ga_{1-x1}N$ ($0 \leq x1 < 1$), the first semiconductor member including a first partial region, a second partial region, a third partial region, a fourth partial region, a fifth partial region, a sixth partial region, and a seventh partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fourth partial region in the first direction and the position of the third partial region in the first direction, a position of the seventh partial region in the first direction being between the position of the third partial region in the first direction and the position of the fifth partial region in the first direction;

a second semiconductor member including $Al_{x2}Ga_{1-x2}N$ ($0 < x2 \leq 1$, $x1 < x2$), the second semiconductor member including a first semiconductor portion and a second semiconductor portion, a direction from the fourth partial region to the first semiconductor portion being along the second direction, a direction from the fifth partial region to the second semiconductor portion being along the second direction;

a first compound member includes $Al_{z1}Ga_{1-z1}N$ ($0 < z1 \leq 1$, $x2 < z1$), the first compound member including a first region, a second region, a third region, a fourth region, and a fifth region, the first region being provided between the fourth partial region and the first electrode portion in the first direction, the second region being provided between the first electrode portion and the fifth partial region in the first direction, the third region being provided between the third partial region and the first electrode portion in the second direction, the fourth region being provided between the first region and the third region, the fifth region being provided between the third region and the second region, the third region including crystal; and a first insulating member including a first insulating portion and a second insulating portion, the first insulating portion being provided between the fourth partial region and the third region in the first direction, the first insulating portion being provided between the sixth partial region and the fourth region in the second direction, the second insulating portion being provided between the third region and the fifth partial region in the first direction, the second insulating portion being provided between the seventh partial region and the fifth region in the second direction, at least a part of the first insulating portion and at least a part of the second insulating portion being amorphous.

(Technical Proposal 2)

The semiconductor device according to Technical proposal 1, wherein the first region and the second region include crystal.

(Technical Proposal 3)

The semiconductor device according to Technical proposal 2, wherein at least a part of the fourth region and at least a part of the fifth region are amorphous.

(Technical Proposal 4)

The semiconductor device according to any one of Technical proposals 1-3, further comprising:

a second insulating member, the second insulating member including a first insulating region, a second insulating region, and a third insulating region, the first insulating region being provided between the first region and the first electrode portion in the first direction, the second insulating region being provided between the first electrode portion and the second region in the first direction, and the third insulating region being provided between the third region and the first electrode portion, between the fourth region and the first electrode portion, and between the fifth region and the first electrode portion.

(Technical Proposal 5)

The semiconductor device according to Technical proposal 4, wherein the second insulating member includes silicon and oxygen, the first insulating member includes silicon and nitrogen, and the first insulating member does not include oxygen, or a concentration of oxygen in the first insulating member is lower than a concentration of oxygen in the second insulating member.

(Technical Proposal 6)

The semiconductor device according to Technical proposal 4 or 5, wherein the first insulating member further includes a third insulating portion and a fourth insulating portion, the first semiconductor portion is provided between the fourth partial region and the third insulating portion in the second direction, and the second semiconductor portion is provided between the fifth partial region and the fourth insulating portion in the second direction.

(Technical Proposal 7)

The semiconductor device according to Technical proposal 6, wherein the second insulation member further includes a fourth insulation region and a fifth insulation region, the third insulating portion is provided between the first semiconductor portion and the fourth insulating region in the second direction, and the fourth insulating portion is provided between the second semiconductor portion and the fifth insulating region in the second direction.

(Technical Proposal 8)

The semiconductor device according to any one of Technical proposals 1-7, wherein a first region length of the first region along the second direction is 150 nm or more, and a second region length along the second direction of the second region is 150 nm or more.

(Technical Proposal 9)

The semiconductor device according to any one of Technical proposals 1-8, wherein a first distance between the first electrode and the third electrode is shorter than a second distance between the third electrode and the second electrode, a first sum is shorter than a second sum, the first sum is a sum of a first insulating portion length of the first insulating portion along the first direction and a first insulating portion thickness of the first insulating portion along the second direction, and the second sum is a sum of a second insulating portion length along the first direction of the second insulating portion and a second insulating portion thickness along the second direction of the second insulating portion.

(Technical Proposal 10)

The semiconductor device according to any one of Technical proposals 1-8, wherein a first ratio of a first insulating portion length of the first insulating portion along the first direction to a first insulating portion thickness of the first insulating portion along the second direction is not less than 0.5 and not more than 1.5, and a second ratio of the second insulating portion length of the second insulating portion along the first direction to a second insulating portion thickness of the second insulating portion along the second direction is not more than 0.5 and not more than 1.5.

(Technical Proposal 11)

The semiconductor device according to any one of Technical proposals 1-8, wherein a first insulating portion length of the first insulating portion along the first direction is not less than 5 nm and not more than 200 nm, and a second insulating portion length of the second insulating portion along the first direction is not less than 5 nm and not more than 200 nm.

(Technical Proposal 12)

The semiconductor device according to any one of Technical proposals 1-8, wherein a ratio of a first insulating portion length of the first insulating portion along the first direction to a third region length of the third region along the first direction is not less than 0.01 and less than 0.5, and a ratio of a second insulating portion length of the second insulating portion along the first direction to the third region length is not less than 0.01 and less than 0.5.

(Technical Proposal 13)

The semiconductor device according to any one of Technical proposals 1-8, wherein a first insulating portion thickness of the first insulating portion along the second direction is not less than 5 nm and not more than 700 nm, and a second insulating portion thickness of the second insulating portion along the second direction is not less than 5 nm and not more than 700 nm.

(Technical Proposal 14)

The semiconductor device according to any one of Technical proposals 1-13, wherein the first electrode portion is provided between the fourth partial region and the fifth partial region in the first direction.

(Technical Proposal 15)

The semiconductor device according to any one of Technical proposals 1-14, wherein the third region contacts the third partial region, the first insulating portion contacts the sixth partial region, and the second insulating portion contacts the seventh partial region.

(Technical Proposal 16)

The semiconductor device according to any one of Technical proposals 1-15, wherein the fourth partial region includes:

a first portion contacting the first region; and a second portion contacting the first insulating portion, and a first crystallinity of the first portion is higher than a second crystallinity of the second portion.

(Technical Proposal 17)

The semiconductor device according to Technical proposal 16, wherein the fourth partial region further includes a third portion contacting the fourth region, and a third crystallinity of the third portion is lower than the first crystallinity.

(Technical Proposal 18)

The semiconductor device according to any one of Technical proposals 1-17, wherein the fifth partial region includes:

a fourth portion contacting the second region; and a fifth portion contacting the second insulating portion, and a fourth crystallinity of the fourth portion is higher than a fifth crystallinity of the fifth portion.

(Technical Proposal 19)

The semiconductor device according to Technical proposal 18, wherein the fifth partial region further includes a sixth portion contacting the fifth region, and a sixth crystallinity of the sixth portion is lower than the fourth crystallinity.

(Technical Proposal 20)

The semiconductor device according to any one of Technical proposals 1-19, wherein the z1 is not less than 0.9 and not more than 1.

According to the embodiment, a semiconductor device with improved characteristics can be provided.

In the specification, “nitride semiconductor” includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. “Nitride semiconductor” further includes Group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the semiconductor devices such as semiconductor members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first electrode;

a second electrode;

a third electrode including a first electrode portion, a position of the third electrode in a first direction from the first electrode to the second electrode being between a position of the first electrode in the first direction and a position of the second electrode in the first direction;

a first semiconductor member including $Al_{x1}Ga_{1-x1}N$ ($0 \le x1 < 1$), the first semiconductor member including a first partial region, a second partial region, a third partial region, a fourth partial region, a fifth partial region, a sixth partial region, and a seventh partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fourth partial region in the first direction and the position of the third partial region in the first direction, a position of the seventh partial region in the first direction being between the position of the third partial region in the first direction and the position of the fifth partial region in the first direction;

a second semiconductor member including $Al_{x2}Ga_{1-x2}N$ ($0 < x2 \le 1$, $x1 < x2$), the second semiconductor member including a first semiconductor portion and a second semiconductor portion, a direction from the fourth partial region to the first semiconductor portion being along the second direction, a direction from the fifth partial region to the second semiconductor portion being along the second direction;

a first compound member including $Al_{z1}Ga_{1-z1}N$ ($0 < z1 \le 1$, $x2 < z1$), the first compound member including a first region, a second region, a third region, a fourth region, and a fifth region, the first region being provided between the fourth partial region and the first electrode portion in the first direction, the second region being provided between the first electrode portion and the fifth partial region in the first direction, the third region being provided between the third partial region and the first electrode portion in the second direction, the fourth region being provided between the first region and the third region, the fifth region being provided between the third region and the second region, the third region including crystal; and a first insulating member including a first insulating portion and a second insulating portion, the first insulating portion being provided between the fourth partial region and the third region in the first direction, the first insulating portion being provided between the sixth partial region and the fourth region in the second direction, the second insulating portion being provided between the third region and the fifth partial region in the first direction, the second insulating portion being provided between the seventh partial region and the fifth region in the second direction, at least a part of the first insulating portion and at least a part of the second insulating portion being amorphous, wherein the first region and the second region include crystal, and at least a part of the fourth region and at least a part of the fifth region are amorphous.

2. The semiconductor device according to claim 1, further comprising:

a second insulating member, the second insulating member including a first insulating region, a second insulating region, and a third insulating region, the first insulating region being provided between the first region and the first electrode portion in the first direction, the second insulating region being provided between the first electrode portion and the second region in the first direction, and the third insulating region being provided between the third region and the first electrode portion, between the fourth region and the first electrode portion, and between the fifth region and the first electrode portion.

3. The semiconductor device according to claim 2, wherein the second insulating member includes silicon and oxygen, the first insulating member includes silicon and nitrogen, and the first insulating member does not include oxygen, or a concentration of oxygen in the first insulating member is lower than a concentration of oxygen in the second insulating member.

4. The semiconductor device according to claim 2, wherein the first insulating member further includes a third insulating portion and a fourth insulating portion, the first semiconductor portion is provided between the fourth partial region and the third insulating portion in the second direction, and the second semiconductor portion is provided between the fifth partial region and the fourth insulating portion in the second direction.

5. The semiconductor device according to claim 4, wherein the second insulation member further includes a fourth insulation region and a fifth insulation region, the third insulating portion is provided between the first semiconductor portion and the fourth insulating region in the second direction, and the fourth insulating portion is provided between the second semiconductor portion and the fifth insulating region in the second direction.

6. The semiconductor device according to claim 1, wherein a first distance between the first electrode and the third electrode is shorter than a second distance between the third electrode and the second electrode, a first sum is shorter than a second sum, the first sum is a sum of a first insulating portion length of the first insulating portion along the first direction and a first insulating portion thickness of the first insulating portion along the second direction, and the second sum is a sum of a second insulating portion length along the first direction of the second insulating portion and a second insulating portion thickness along the second direction of the second insulating portion.

7. The semiconductor device according to claim 1, wherein a first ratio of a first insulating portion length of the first insulating portion along the first direction to a first insulating portion thickness of the first insulating portion along the second direction is not less than 0.5 and not more than 1.5, and a second ratio of the second insulating portion length of the second insulating portion along the first direction to a second insulating portion thickness of the second insulating portion along the second direction is not more than 0.5 and not more than 1.5.

8. The semiconductor device according to claim 1, wherein a first insulating portion length of the first insulating portion along the first direction is not less than 5 nm and not more than 200 nm, and a second insulating portion length of the second insulating portion along the first direction is not less than 5 nm and not more than 200 nm.

9. The semiconductor device according to claim 1, wherein a ratio of a first insulating portion length of the first insulating portion along the first direction to a third region length of the third region along the first direction is not less than 0.01 and less than 0.5, and a ratio of a second insulating portion length of the second insulating portion along the first direction to the third region length is not less than 0.01 and less than 0.5.

10. The semiconductor device according to claim 1, wherein a first insulating portion thickness of the first insulating portion along the second direction is not less than 5 nm and not more than 700 nm, and a second insulating portion thickness of the second insulating portion along the second direction is not less than 5 nm and not more than 700 nm.

11. The semiconductor device according to claim 1, wherein the first electrode portion is provided between the fourth partial region and the fifth partial region in the first direction.

12. The semiconductor device according to claim 1, wherein the third region contacts the third partial region, the first insulating portion contacts the sixth partial region, and the second insulating portion contacts the seventh partial region.

13. The semiconductor device according to claim 1, wherein the fifth partial region includes:

a fourth portion contacting the second region; and a fifth portion contacting the second insulating portion, and a fourth crystallinity of the fourth portion is higher than a fifth crystallinity of the fifth portion.

14. The semiconductor device according to claim 13, wherein the fifth partial region further includes a sixth portion contacting the fifth region, and a sixth crystallinity of the sixth portion is lower than the fourth crystallinity.

15. The semiconductor device according to claim 1, wherein the z1 is not less than 0.9 and not more than 1.

16. A semiconductor device. comprising:

a first electrode:

a second electrode;

a third electrode including a first electrode portion, a position of the third electrode in a first direction from the first electrode to the second electrode being between a position of the first electrode in the first direction and a position of the second electrode in the first direction;

a first semiconductor member including $Al_{x1}Ga_{1-x1}N$ ($0 \leq x1 < 1$), the first semiconductor member including a first partial region, a second partial region, a third partial region, a fourth partial region, a fifth partial region, a sixth partial region, and a seventh partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fourth partial region in the first direction and the position of the third partial region in the first direction, a position of the seventh partial region in the first direction being between the position of the third partial region in the first direction and the position of the fifth partial region in the first direction:

a second semiconductor member including $Al_{x2}Ga_{1-x2}N$ ($0 < x2 \leq 1$, $x1 < x2$), the second semiconductor member including a first semiconductor portion and a second semiconductor portion, a direction from the fourth partial region to the first semiconductor portion being along the second direction, a direction from the fifth partial region to the second semiconductor portion being along the second direction;

a first compound member including $Al_{z1}Ga_{1-z1}N$ ($0 < z1 \leq 1$, $x2 < z1$), the first compound member including a first region, a second region, a third region, a fourth region, and a fifth region, the first region being provided between the fourth partial region and the first electrode portion in the first direction, the second region being provided between the first electrode portion and the fifth partial region in the first direction, the third region being provided between the third partial region and the first electrode portion in the second direction, the fourth region being provided between the first region and the third region, the fifth region being provided between the third region and the second region, the third region including crystal; and a first insulating member including a first insulating portion and a second insulating portion, the first insulating portion being provided between the fourth partial region and the third region in the first direction, the first insulating portion being provided between the sixth partial region and the fourth region in the second direction, the second insulating portion being provided between the third region and the fifth partial region in the first direction, the second insulating portion being provided between the seventh partial region and the fifth region in the second direction, at least a part of the first insulating portion and at least a part of the second insulating portion being amorphous, wherein a first region length of the first region along the second direction is 150 nm or more, and a second region length along the second direction of the second region is 150 nm or more.

17. A semiconductor device, comprising:

a first electrode:

a second electrode;

a third electrode including a first electrode portion, a position of the third electrode in a first direction from the first electrode to the second electrode being between a position of the first electrode in the first direction and a position of the second electrode in the first direction;

a first semiconductor member including AlyGaryN (0 <x1 <1), the first semiconductor member including a first partial region, a second partial region, a third partial region, a fourth partial region, a fifth partial region, a sixth partial region, and a seventh partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fourth partial region in the first direction and the position of the third partial region in the first direction, a position of the seventh partial region in the first direction being between the position of the third partial region in the first direction and the position of the fifth partial region in the first direction:

a second semiconductor member including $Al_{x2}Ga_{1-x2}N$ ($0 < x2 \leq 1$, $x1 < x2$), the second semiconductor member including a first semiconductor portion and a second semiconductor portion, a direction from the fourth partial region to the first semiconductor portion being along the second direction, a direction from the fifth partial region to the second semiconductor portion being along the second direction;

a first compound member including $Al_{z1}Ga_{1-z1}N$ ($0<z1\leq 1$, $x2<z1$), the first compound member including a first region, a second region, a third region, a fourth region, and a fifth region, the first region being provided between the fourth partial region and the first electrode portion in the first direction. the second region being provided between the first electrode portion and the fifth partial region in the first direction, the third region being provided between the third partial region and the first electrode portion in the second direction, the fourth region being provided between the first region and the third region, the fifth region being provided between the third region and the second region, the third region including crystal; and a first insulating member including a first insulating portion and a second insulating portion, the first insulating portion being provided between the fourth partial region and the third region in the first direction. the first insulating portion being provided between the sixth partial region and the fourth region in the second direction, the second insulating portion being provided between the third region and the fifth partial region in the first direction, the second insulating portion being provided between the seventh partial region and the fifth region in the second direction, at least a part of the first insulating portion and at least a part of the second insulating portion being amorphous, wherein the fourth partial region includes:

a first portion contacting the first region; and a second portion contacting the first insulating portion, and a first crystallinity of the first portion is higher than a second crystallinity of the second portion.

18. The semiconductor device according to claim 17, wherein the fourth partial region further includes a third portion contacting the fourth region, and a third crystallinity of the third portion is lower than the first crystallinity.

* * * * *